(12) United States Patent
Zhang et al.

(10) Patent No.: US 9,947,882 B2
(45) Date of Patent: Apr. 17, 2018

(54) ELECTRONIC DEVICES WITH ROBUST FLEXIBLE DISPLAYS

(71) Applicant: Apple Inc., Cupertino, CA (US)

(72) Inventors: Zhen Zhang, San Jose, CA (US); Yifan Zhang, San Mateo, CA (US); Paul S. Drzaic, Morgan Hill, CA (US); Paul C. Kelley, San Francisco, CA (US); James P. Landry, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 11 days.

(21) Appl. No.: 15/211,714

(22) Filed: Jul. 15, 2016

(65) Prior Publication Data

US 2017/0092884 A1    Mar. 30, 2017

Related U.S. Application Data

(60) Provisional application No. 62/232,653, filed on Sep. 25, 2015.

(51) Int. Cl.
| | |
|---|---|
| *H01L 51/52* | (2006.01) |
| *H01L 51/00* | (2006.01) |
| *G06F 3/041* | (2006.01) |
| *G06F 1/16* | (2006.01) |

(52) U.S. Cl.
CPC ........ *H01L 51/0097* (2013.01); *G06F 1/1616* (2013.01); *G06F 1/1652* (2013.01); *G06F 3/0412* (2013.01); *H01L 51/5253* (2013.01); *H01L 51/5275* (2013.01); *G06F 2203/04102* (2013.01)

(58) Field of Classification Search
CPC ............ H01L 23/5387; H01L 51/0097; H01L 51/5253; H01L 2251/5338; G06F 1/1616; G06F 1/1618; G06F 1/1652
See application file for complete search history.

(56) References Cited

U.S. PATENT DOCUMENTS

| | | |
|---|---|---|
| 7,768,193 B2 | 8/2010 | Tsutsui et al. |
| 8,298,431 B2 | 10/2012 | Chwu et al. |
| 9,541,962 B2 | 1/2017 | Siddiqui |

(Continued)

FOREIGN PATENT DOCUMENTS

WO    20081747191    12/2008

*Primary Examiner* — Hoai V Pham
(74) *Attorney, Agent, or Firm* — Treyz Law Group, P.C.; Kendall W. Abbasi

(57) ABSTRACT

An electronic device may have a hinge that allows the device to be flexed about a bend axis. A display may span the bend axis. To protect display elements such as pixel circuitry from excessive mechanical stress, the display may include one or more structural protective layers. A structural layer may be incorporated into the display stack as a supportive backing behind the pixel circuitry and/or as a protective cover over the pixel circuitry. The structural layer may include rigid portions and flexible portions. The flexible portions may contain flexible material that separates and adjoins adjacent rigid structures or that fills grooves between adjacent rigid portions. The rigid portions may be formed from thin sheets of glass or other transparent materials. The flexible material in the structural layer may be an elastomeric material having a refractive index that matches that of the glass sheets in the structural layer.

20 Claims, 13 Drawing Sheets

(56) References Cited

U.S. PATENT DOCUMENTS

| | | |
|---|---|---|
| 9,544,993 B2 | 1/2017 | Lee et al. |
| 2008/0018226 A1 | 1/2008 | Moon |
| 2013/0076649 A1 | 3/2013 | Myers et al. |
| 2013/0083496 A1 | 4/2013 | Franklin et al. |
| 2013/0216740 A1 | 8/2013 | Russell-Clarke et al. |
| 2014/0328041 A1* | 11/2014 | Rothkopf ............ H04M 1/0216 361/807 |
| 2015/0043174 A1 | 2/2015 | Han et al. |
| 2015/0210588 A1 | 7/2015 | Chang et al. |

\* cited by examiner

US 9,947,882 B2

ELECTRONIC DEVICES WITH ROBUST FLEXIBLE DISPLAYS

This application claims the benefit of provisional patent application No. 62/232,653, filed on Sep. 25, 2015, which is hereby incorporated by reference herein in its entirety.

BACKGROUND

This relates generally to electronic devices, and, more particularly, to electronic devices with displays.

Electronic devices often include displays for presenting image to a user. Displays are typically formed from rigid planar substrates. Although satisfactory in many situations, rigid displays such as these may be difficult to integrate into certain devices, such as devices with bendable housings.

It would therefore be desirable to be able to provide improved displays for electronic devices.

SUMMARY

An electronic device may have a display. The electronic device may have a hinge that allows the device to be flexed about a bend axis. The display may overlap the bend axis.

To protect display elements such as pixel circuitry from excessive mechanical stress, the display may include one or more structural protective layers. A structural layer may be incorporated into the display stack as a supportive backing behind the pixel circuitry and/or as a protective cover over the pixel circuitry.

The structural layer may include rigid portions and flexible portions. The flexible portions may contain flexible material that separates and adjoins adjacent rigid structures or that fills grooves between adjacent rigid portions.

The rigid structures in the structural layer may be formed from thin sheets of glass or other transparent materials. The flexible material in the structural layer may be an elastomeric material having a refractive index that matches that of the rigid structures.

The flexible material may form flexible joints between adjacent rigid structures to isolate and absorb impact energy so that it does not travel to adjacent rigid structures or other components in the electronic device. The flexible portions in the structural layer may facilitate bending of the display about the bend axis. The flexible portions of the structural layer may be aligned with the bend axis of the display and/or may be located in regions of the display that do not flex or bend.

DETAILED DESCRIPTION

Figure 1:
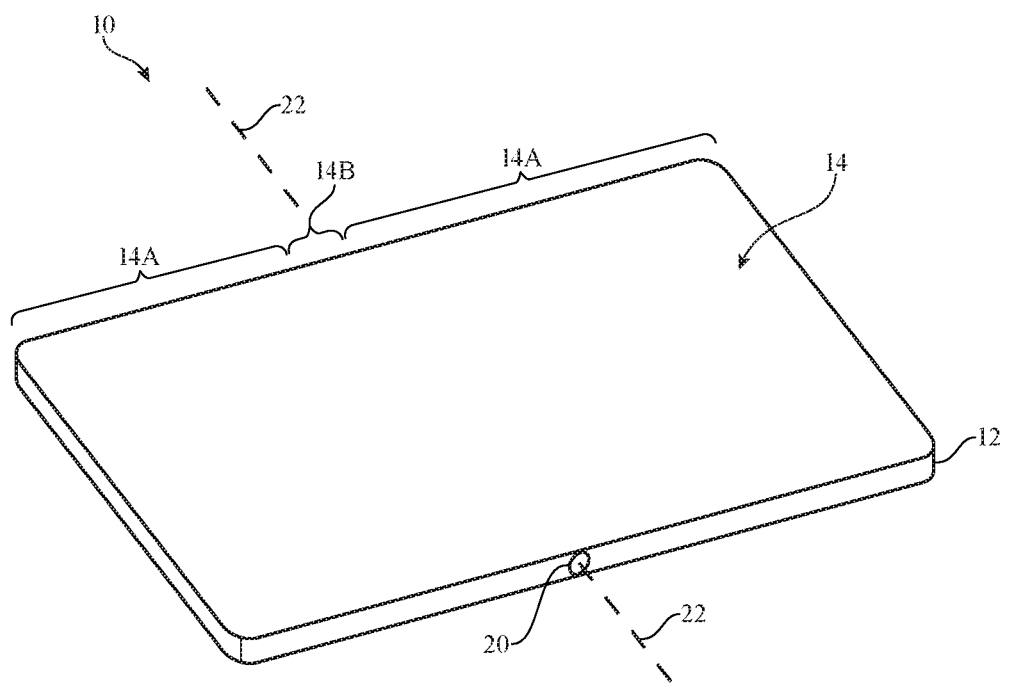
FIG. 1 is a perspective view of an illustrative electronic device having a display in accordance with an embodiment.

An illustrative electronic device of the type that may be provided with a flexible display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a wearable or miniature device of other types, a computer display that does not contain an embedded computer, a computer display that includes an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, watch or other wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Housing 12 may have hinge structures such as hinge 20 to allow device 10 to bend about bend axis 22.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures. A touch sensor may be formed using electrodes or other structures on a display layer that contains a pixel array or on a separate touch panel layer that is attached to the pixel array (e.g., using adhesive).

Display 14 may include pixels formed from liquid crystal display (LCD) components, electrophoretic pixels, micro-electromechanical (MEMS) shutter pixels, electrowetting pixels, micro-light-emitting diodes (small crystalline semiconductor die), organic light-emitting diodes (e.g., a thin-film organic light-emitting diode display), quantum dot light-emitting diodes, or pixels based on other display technologies. Configurations in which display 14 is a light-emitting diode display such as an organic light-emitting diode display may sometimes be described herein as an example.

Display 14 may include multiple layers. The layers of display 14 may include one or more layers such as an outer protective layer with a polarizer, a touch panel layer, a thin-film transistor layer containing thin-film transistor circuitry and associated organic light-emitting diodes or other pixels on a polymer substrate, and a supporting backing layer. More display layers or fewer display layers and/or different types of layers may be included in display 14, if desired. A display cover layer or other layer may form the outermost surface of the display. Display layers such these (e.g., display cover layers) may be formed from glass, plastic, and/or other transparent display cover layer structures and may have a flexible center portion aligned with the bend axis of device 10.

Display layers may be formed from plastic (polymer), glass, metal, or other suitable materials. When constructed from sufficiently thin layers of material (e.g., 20 microns or less, 30 microns or less, 50 microns or less, 1-40 microns, or other suitable thicknesses), the display layers may be bent without experiencing potentially damaging plastic deformation or cracking. In a display configuration with multiple thin layers such as these, display 14 may therefore be bent back and forth about bend axis 22 without damaging display 14.

Display 14 may include flexible regions such as region 14B that allow display 14 to be bent, curved, or folded and structural regions such as regions 14A that provide structure and impact protection for display 14. In the example of FIG. 1, the center portion of display 14 (and, if desired, some or all of the remaining portions of display 14) may be flexible to allow display 14 to be bent along bend axis 22 of device 10.

The center of the display panel may be formed using flexible structures. In areas 14A, display 14 may be flexible or may be rigid (e.g., the display panel structures in these areas may be rigid and/or the display cover layer structures in these areas may be rigid). In the example of FIG. 1, flexible area 14B forms a strip that lies between structural areas 14A. To ensure that flexible area 14B is sufficiently flexible to allow device 10 to bend about axis 22, display layers such as a display cover layer for display 14 may be provided with flexible structures in area 14B. Underlying display layers in a display panel (e.g., an internal structural layer, a polymer substrate, metal traces, and other conducting and dielectric layers in an organic light-emitting diode panel) may also be provided with structures that are flexible and can be bent without damage in regions 14B.

The example of FIG. 1 in which display 14 bends about a bend axis at the center of the display that extends across the width of the display is merely illustrative. If desired, display 14 may bend about an axis that is perpendicular to axis 22 of FIG. 1 (i.e., an axis that extends along the length of display 14) and/or an axis that is not at the center of the display. Configurations in which display 14 bends about multiple axes (e.g., multiple parallel or non-parallel axes) may also be used. Arrangements in which display 14 bends about axis 22 are sometimes described herein as an illustrative example.

Figure 2:
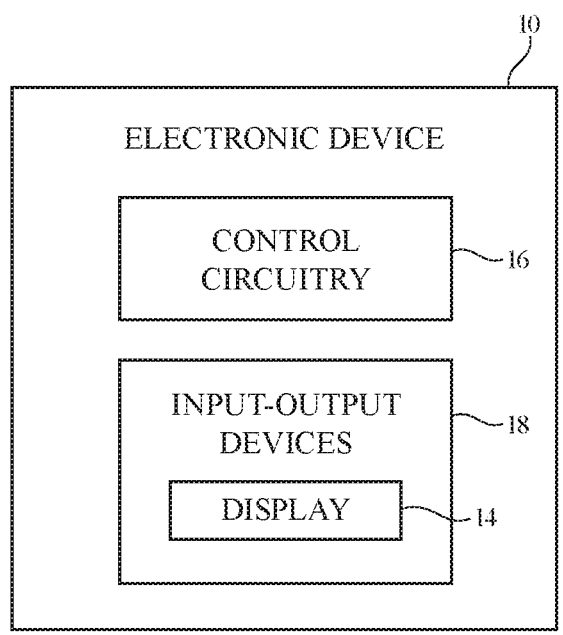
FIG. 2 is a schematic diagram of an illustrative electronic device having a display in accordance with an embodiment.

A schematic diagram of an illustrative electronic device such as device 10 of FIG. 1 is shown in FIG. 2. As shown in FIG. 2, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18. Input-output devices 18 may include a display such as display 14 of FIG. 1.

Control circuitry 16 may be used to run software on device 10 such as operating system code and applications. During operation of device 10, the software running on control circuitry 16 may display images on display 14 (e.g., video, still images such as text, alphanumeric labels, photographs, icons, other graphics, etc.) using an array of pixels in display 14.

Figure 3:
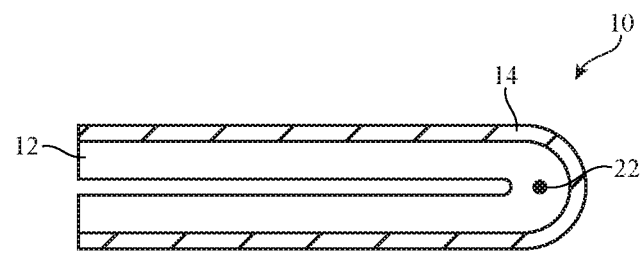
FIGS. 3 and 4 are cross-sectional side views of electronic devices with flexible displays in accordance with an embodiment.
Figure 4:
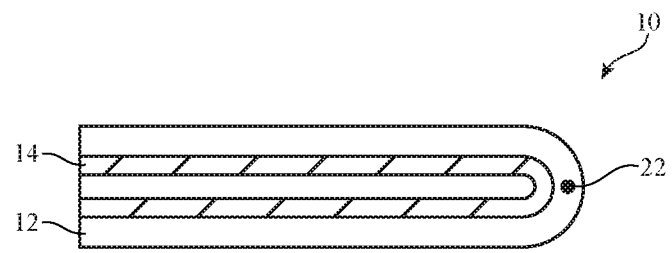

As shown in FIG. 3, device 10 may be folded (bent by 180° or other suitable amount) about bend axis 22 so that display 14 is visible from the outside of device 10 in its folded state. FIG. 4 shows how device 10 may be folded about bend axis 22 so that display 14 is protected within the interior of device 10. Device 10 may have hinges that allow outward bending of the type shown in FIG. 3, that allow inward bending of the type shown in FIG. 4, or that allow bending of both the type shown in FIG. 3 and the type shown in FIG. 4. Configurations in which device 10 is flexed by different amounts (e.g., more than 180° or less than 180°) may also be used.

Display 14 may have an outermost layer formed from clear glass, transparent plastic, sapphire, or other transparent materials that serve as a protective layer for thin-film transistor circuitry and other display structures. The outer display layer may sometimes be referred to as a display cover layer. In some configurations for display 14, the outermost layer of the display may serve both as a protective layer (display cover layer) and as a substrate for display structures (touch sensors electrodes, color filter elements, thin-film transistors, etc.). In other configurations, the display cover layer is free of circuitry and serves solely as a protective layer for underlying display structures (e.g., one or more underlying display panels).

To provide display 14 with increased robustness, one or more structural protective layers may be incorporated into the layers that form display 14. The protective layer may have one or more rigid portions and one or more flexible portions. The rigid portions of the protective layer may increase the stiffness of display 14 in those regions while isolating impact energy, while the flexible portions of the protective layer may allow display 14 to remain flexible and bendable.

Figure 5:
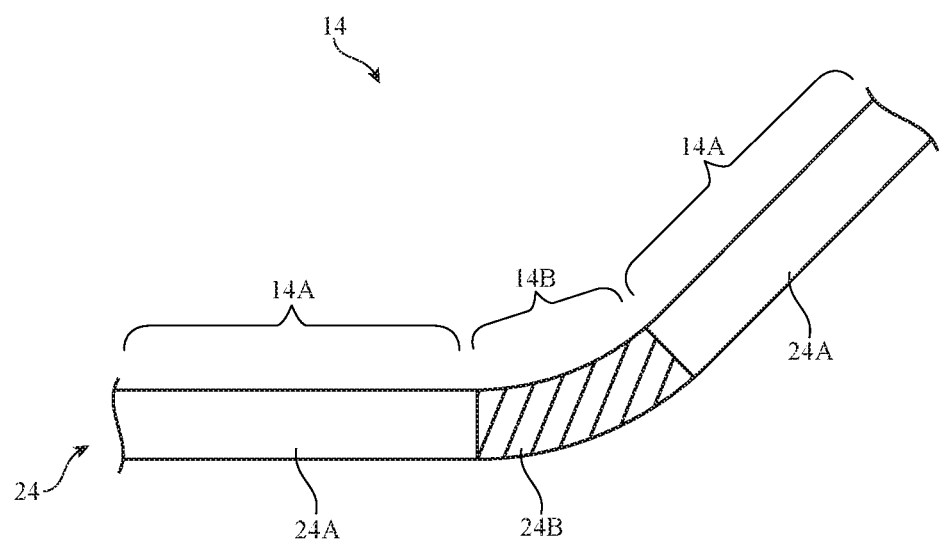
FIG. 5 is a cross-sectional side view of an illustrative structural layer having rigid and flexible portions in accordance with an embodiment.

As shown in FIG. 5, a protective layer for display 14 (i.e., protective layer 24) may have rigid portions such as rigid portions 24A and flexible portions such as flexible portion 24B. Rigid portions 24A may, for example, be rigid planar layers. Configurations in which portions 24A have non-planar shapes and/or are formed from flexible structures may also be used. Between rigid planar portions 24A of protective layer 24, protective layer 24 may have flexible portion 24B. Portion 24B may bend about bend axis 22 to allow display 14 to bend as housing 12 is bent about hinge 20.

In the example of FIG. 5, flexible portion 24B of protective layer 24 aligns with flexible region 14B of display 14 (e.g., the region of display 14 that bends about bend axis 22). This is, however, merely illustrative. If desired, protective layer 24 may include flexible regions 24B in rigid areas 14A of display 14 (e.g., in areas of display 14 that do not bend, that are prevented from being bent, or that are otherwise less flexible than regions 14B).

Figure 6:
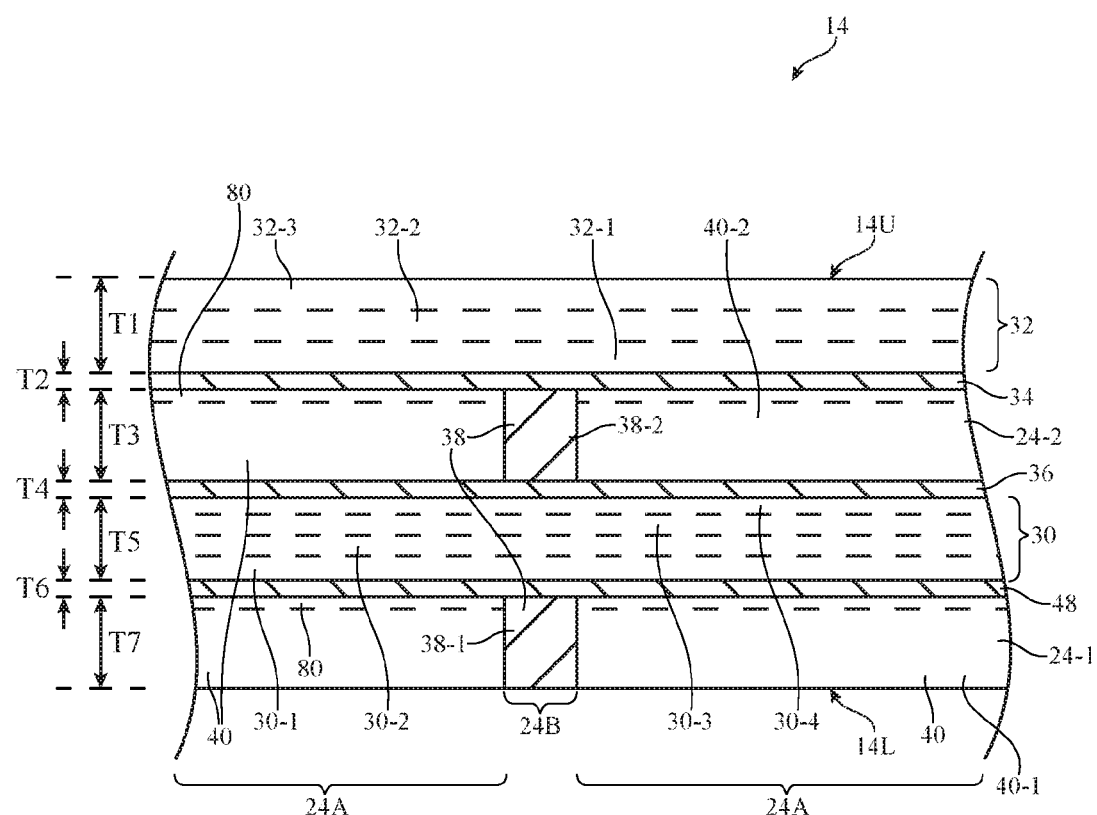
FIG. 6 is a cross-sectional side view of an illustrative display having display circuitry interposed between first and second structural layers in accordance with an embodiment.

FIG. 6 is a cross-sectional side view of display 14 in an illustrative configuration in which protective layers of the type shown in FIG. 5 are incorporated into display 14. As shown in FIG. 6, display 14 may include display layers 30 and additional layers 32. Display layers 30 may include substrate layer 30-1, thin-film transistor layer 30-2, pixel structures 30-3, and moisture barrier layer 30-4. Substrate 30-1 may be a flexible polymer substrate formed from a flexible sheet of polyimide or other suitable flexible material. Thin-film transistors 30-2 may be used to control display pixels 30-3. Pixel structures 30-3 may include organic light-emitting diode display pixels or other suitable display pixels. Moisture barrier layer 30-4 may be a thin-film encapsulation layer formed from silicon nitride or other inorganic material. Display layers 30 may have a total thickness T5 of about 20 microns, 15-30 microns, 20-50 microns, more than 50 microns, or less than 50 microns.

Top layers 32 may include layers such as touch-sensitive layer 32-1, polarizer layer 32-2, and functional layers 32-3. Touch-sensitive layer 32-1 may include touch sensor circuitry such as capacitive touch sensor electrodes (e.g., formed from indium tin oxide, thin metal, or other transparent conductive material) or other suitable touch-sensitive circuitry. Polarizer layer 32-2 may, for example, be a circular polarizer that reduces reflections from display 14. Functional layers 32-3 may include a hard outer layer (e.g., formed from one or more inorganic layers such as silicon nitride, silicon oxide, etc.) that provides a scratch resistant surface of the type that is sometimes referred to as a hardcoat. Other layers that may be included in functional layers 32-3 include an anti-smudge layer, an antireflection layer, an antistatic layer, layers that perform the functions of two or more of these layers, etc. Top layers 32 may have a total thickness T1 of about 100 microns, 70-100 microns, 80-90 microns, 90-120 microns, greater than 100 microns, or less than 100 microns.

The layers shown in FIG. 6 are merely illustrative. If desired, display 14 may have a fewer number of layers, a greater number of layers, a different order of layers, or other suitable configuration.

Display layers 30 and additional layers 32 may be formed using flexible materials to allow display 14 to be bent, curved, or folded (e.g., folded about bend axis 22). For example, polymer materials such as polyimide may be used to form at least some of display layers 30 and additional layers 32. Other elements in display 14 such as thin-film encapsulation layer 30-4 and thin-film transistor circuitry 30-2 may be formed from inorganic brittle layers. The use of polymer materials enables bending of display 14, but care must be taken to ensure that deformation of display 14 does not damage any of the layers within display 14. For example, if care is not taken, excessive deformation of polymer layers can lead to an undesired waviness in the display or can lead to cracking in the thin-film transistor layer, which may in turn lead to "dead" pixels.

To increase the robustness of flexible display 14, protective layers of the type shown in FIG. 5 may be incorporated into display 14. In the example of FIG. 6, first protective layer 24-1 is formed on one side of display layers 30 and second protective layer 24-2 is formed on an opposing side of display layers 30. Protective layers 24-1 and 24-2 may provide the other layers in display 14 with structural support, may help protect display 14 from damage (e.g., damage from impact from a hard object, damage from inadvertent twisting, etc.), may help isolate impact energy, may help ensure that display 14 is planar, and may otherwise help strengthen and support display 14. Lower protective layer 24-1 may have a thickness T7 of about 100 microns, 70-100 microns, 80-90 microns, 90-120 microns, 50-80 microns, greater than 100 microns, or less than 100 microns. Upper protective layer 24-2 may have a thickness T3 of about 50-100 microns, 50-60 microns, 40-80 microns, 80-120 microns, more than 80 microns, or less than 80 microns.

Layers of adhesive may be used to attached the layers of display 14 together. For example, adhesive layer 34 may attach additional layers 32 to upper protective layer 24-2, adhesive layer 36 may attach upper protective layer 24-2 to display layers 30, and adhesive layer 48 may attach display layers 30 to lower protective layer 24-1. Adhesive layers 34 and 36 may be optically clear adhesive to allow light from display layers 30 to exit upper surface 14U of display 14, while adhesive layer 48 need not be transparent (e.g., a pressure sensitive adhesive or other suitable adhesive may be used to form adhesive layer 48). The respective thicknesses T2, T4, and T6 of adhesive layers 34, 36, and 48 may each be about 15-20 microns, 10-30 microns, 30-60 microns, 60-100 microns, 80-120 microns, 100-150 microns, greater than 150 microns, or less than 150 microns.

Sandwiching display layers 30 between protective layers 24-1 and 24-2 may protect display layers 30 from damage when a hard object impacts display 14. Protective layer 24-1 protect display layers 30 from impacts on lower surface 14L of display 14, while protective layer 24-2 protects display layers 30 from impacts on upper surface 14U of display 14 (e.g., the surface of display 14 through which light from display layers 30 exits display 14).

Protective layers 24-1 and 24-2 may have rigid portions 24A and flexible portions 24B. Rigid portions 24A of protective layers 24-1 and 24-2 may be formed from rigid structures 40. Rigid structures 40 may be a material such as glass, metal, plastic, or other suitable material. In one illustrative arrangement, rigid structures 40-2 in upper protective layer 24-2 may be transparent to allow light from display layers 30 to exit upper surface 14L of display 14 and rigid structures 40-1 in protective layer 24-1 may be opaque. In another illustrative arrangement, both rigid structures 40-1 and 40-2 may be transparent. For example, rigid structures 40-1 and 40-2 may be formed from sheets of strengthened glass. If desired, rigid structures 40 may optionally be used as substrates for additional circuitry 80 such as touch sensor circuitry, force sensor circuitry, or other suitable circuitry in display 14.

Rigid structures 40 in protective layers 24-1 and 24-2 may be connected by flexible material 38. Flexible material 38 may be a polymer or other flexible substance. Flexible material 38 may be, for example, a clear elastomeric polymer such as silicone or optically clear adhesive to permit viewing of display layers 30 or may be formed from an opaque polymer. Other filler materials may be used, if desired. In configurations in which material 38 is transparent, material 38 may have an index of refraction that matches the index of refraction of rigid structures 40. For example, rigid structures 40-2 of upper protective layer 24-2 may have an index of refraction of 1.5 and flexible material 38-2 may be formed from a polymer with a matched index of refraction of 1.5 (or 1.4-1.6 or other suitable value close to 1.5).

Material 38 (sometimes referred to as flexible joints 38) may be used to adjoin neighboring rigid structures 40 and to isolate one rigid structure 40 from surrounding rigid structures 40. The presence of flexible material 38 between rigid structures 40 may help isolate and absorb impact energy that may result from an external object striking display 14. The flexible material 38 may also enable folding flexibility in regions 24B of protective layer 24. Thus, protective layers 24 may not only be used to protect underlying display layers 30, but protective layers 24 may also be used to prevent impact energy from transferring from rigid structures 40 to other structures in housing 12 of device 10.

Protective layer 24-1 may have the same construction and design as protective layer 24-2 or the two protective layers may have different features. For example, the thickness T7 of lower protective layer 24-1 may be different than the thickness T3 of upper protective layer 24-2 to adjust the neutral plane position in display 14 such that it intersects with display layers 30 (e.g., such that thin-film transistor layer 30-2 and pixel structures 30-3 are located in the neutral plane of display 14). The properties of flexible joints 38 may also be adjusted to achieve a desired bending ability. For example, flexible joint 38-1 of lower protective layer 24-1 may be larger or smaller than flexible joint 38-2, may be more or less flexible than flexible joint 38-2, may relax more quickly or more slowly than flexible joint 38-2 (e.g., may have a different restoring force than that of material 38-2), etc. Flexible joints 38 may be patterned with holes or may have three-dimensional structuring. Functional components such as sensors, optical structures, mechanical elements, or other components may be embedded into material 38.

Each protective layer 24 may include any suitable number of rigid structures 40 and any suitable number of flexible joints 38. Rigid structures 40 may be completely or partially isolated from one another by flexible joints 38. Rigid structures 40 may be islands of any suitable shape (e.g., rectangular, circular, oval, etc.). Rigid structures 40 may have grooves, curved surfaces, or other surface features to facilitate bending. Rigid structures 40 and flexible joints 38 may have engagement features that help bind structures 40 to joints 38. For example, rigid structures 40 may have protrusions that extend into openings in flexible joints 38 and/or rigid structures 40 may have openings that receive corresponding portions of material 38.

The example of FIG. 6 in which two protective layers 24 are incorporated into display 14 is merely illustrative. If desired, only one protective layer may be incorporated into display 14 or display 14 may have more than two protective layers. Protective layers 24 may be formed in any suitable location in the stack of layers that form display 14. The configuration of FIG. 6 is merely illustrative.

Figure 7:
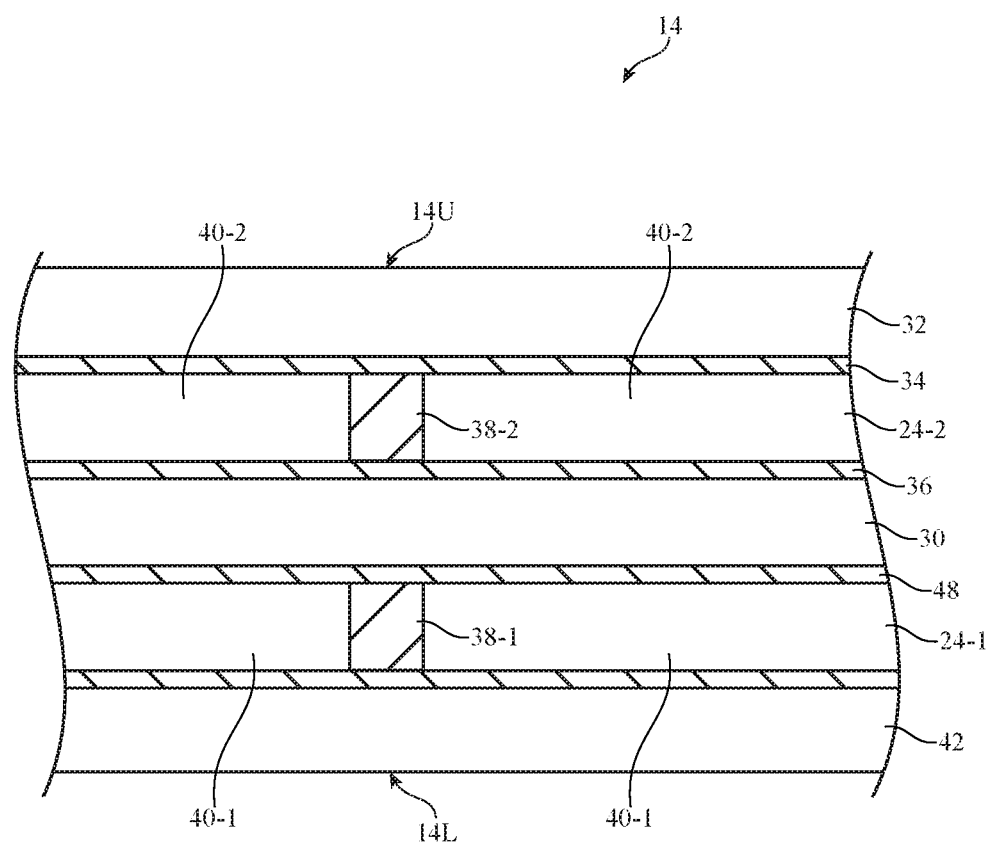
FIG. 7 is a cross-sectional side view of an illustrative display having display circuitry interposed between first and second structural layers and including an additional protective film in accordance with an embodiment.

If desired, an additional protective layer may be formed under lower protective layer 24-1 to provide additional protection to display 14. As shown in FIG. 7, for example, protective film 42 may be formed on lower surface 14L of display 14 to protect layer 24-1 from impacts on surface 14L. Film 42 may be an elastomeric polymer such as silicone or other suitable polymer.

In configurations where structures 40 in protective layers 24 are formed from thin glass sheets and/or where structures 40 include circuitry 80 (e.g., glass-based sensors or other sensitive structures), elastomeric film 42 may help absorb impacts on lower surface 14L and avoid damage to structures 40.

Figure 8:
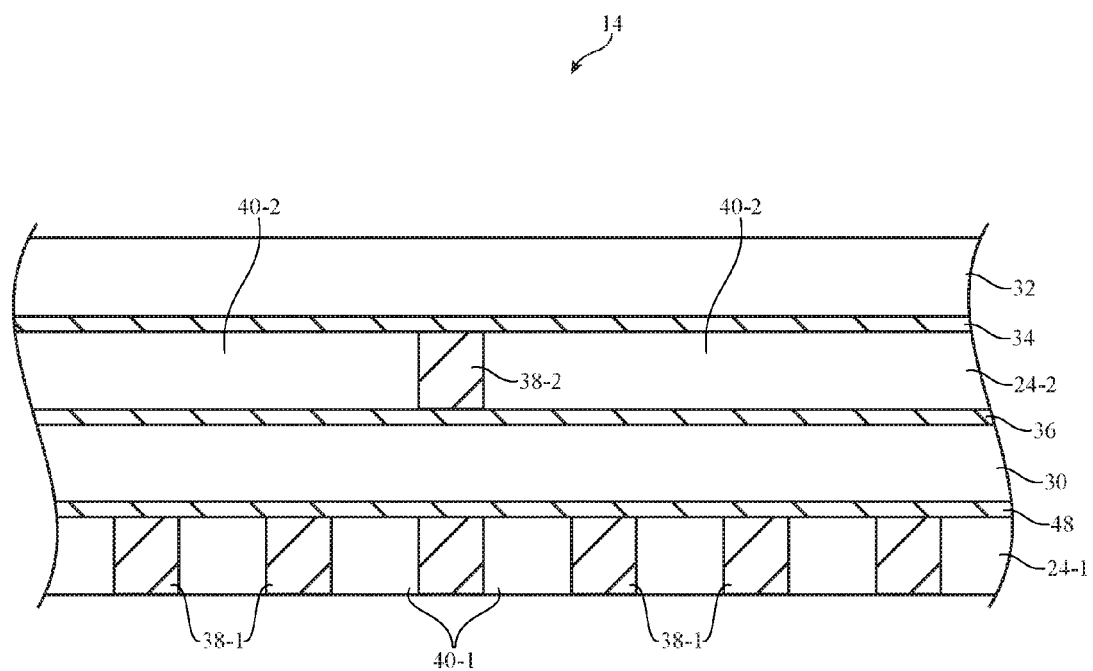
FIG. 8 is a cross-sectional side view of an illustrative display having display circuitry interposed between a first structural layer and a second structural layer having multiple rigid portions and flexible portions in accordance with an embodiment.

FIG. 8 shows an illustrative example in which lower protective layer 24-1 has multiple strips or islands of rigid structures 40-1 separated from and adjoined to one another by flexible joints 38-1. Protective layer 24-1 may, for example, include two, three, four, ten, less than ten, or more than ten individual rigid structures 40 joined together by flexible joints 38. The use of multiple smaller rigid structures 40-1 separated by flexible material 38-1 isolates mechanical stresses to smaller areas of display 14 while also allowing for increased flexibility in protective layer 24-1.

In the example of FIG. 8, lower protective layer 24-1 has more rigid portions 40-1 and flexible joints 38-1 than upper protective layer 24-2. This is merely illustrative. If desired, upper protective layer 24-2 may have more rigid portions 40-2 and flexible joints 38-2 than layer 24-1 or may have the same number of rigid portions 40-2 and flexible joints 38-2.

The examples of FIGS. 6, 7, and 8 in which flexible regions 24B of protective layer 24 are formed using flexible material that separates adjacent rigid structures is merely illustrative. If desired, flexible regions 24B of protective layer 24 may be formed by selectively removing portions of a rigid layer to form recessed areas in flexible regions 24B. By creating one or more recesses in region 24B (relative to portions 24A), the flexibility of protective layer 24 in region 24B may be increased.

Figure 9:
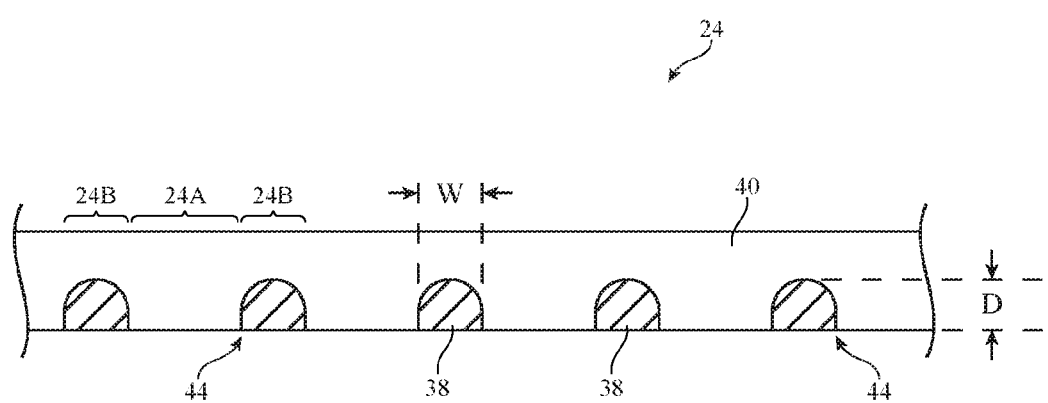
FIG. 9 is a cross-sectional side view of an illustrative structural layer having rigid portions and flexible portions in which the flexible portions are formed from thinned regions of a rigid layer in accordance with an embodiment.

In the illustrative configuration of FIG. 9, protective layer 24 has been provided with grooves 44 in regions 24B. Grooves 44 may have depths D of about 50 microns (or more than 10 microns, more than 20 microns, 30-80 microns, 5-200 microns, less than 250 microns, less than 100 microns, less than 75 microns, less than 50 microns, or other suitable value). Grooves 44 may have widths W of 1-200 microns, more than 5 microns, more than 40 microns, more than 200 microns, more than 500 microns, less than 400 microns, less than 1 mm, less than 100 microns, 0.5-5 mm, or other suitable widths).

In general, any suitable dimensions may be used for the structures of protective layer 24. The use of parallel grooves with semicircular cross-sectional shapes that run across the width of display 14 (e.g., parallel to bend axis 22 of FIG. 1) is merely illustrative.

Grooves 44 may have any suitable shape. As shown in the cross-sectional side view of grooves 44 of FIG. 9, grooves 44 may have a semicircular shape or other shape with curved sidewall surfaces. In other arrangements, grooves 44 may have trapezoidal shapes, rectangular shapes, rectangular shapes with curved corners, or other cross-sectional shapes. The illustrative groove profile of FIG. 9 is merely illustrative.

Flexible material 38 may fill grooves 44 or, if desired, grooves 44 may be filled with air and flexible material 38 may be excluded. The thinned regions of rigid structure 40 in regions 24B may allow increased flexibility in those regions while rigid structure 40 maintains the ability to protect underlying display layers 30 from impact stresses. Flexible material 38 may help support portion 24B of protective layer 24 to prevent cracking.

FIGS. 10-17 show illustrative top views of protective layer 24 with different patterns of rigid regions 24A and flexible regions 24B. In these examples, rigid regions 24A may be formed from one or more rigid structures 40. Flexible regions 24B may be formed using flexible material 38 that separates and adjoins adjacent rigid structures 40 (as shown in the examples of FIGS. 6, 7, and 8) or may be formed using recesses, grooves, or cut-out portions of rigid structure 40 which may or may not be filled with flexible material 38 (e.g., as shown in the example of FIG. 9).

Figure 10:
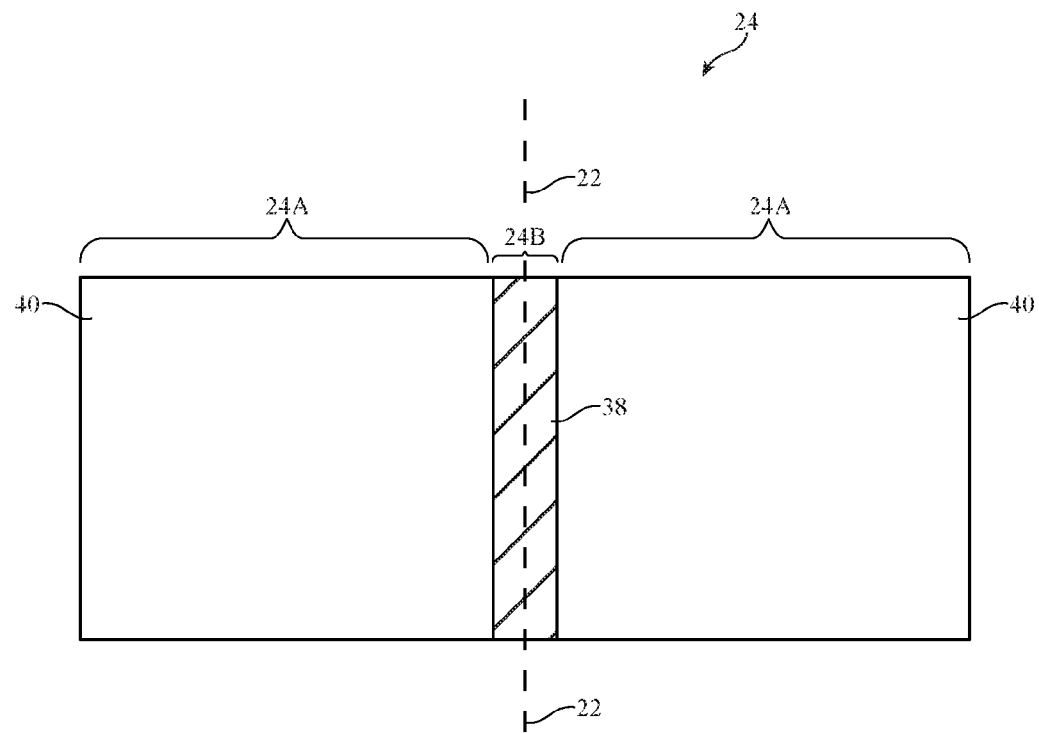
FIGS. 10, 11, 12, 13, 14, 15, 16, and 17 are top views of illustrative patterns for rigid portions and flexible portions of a structural layer for a display in accordance with an embodiment.

In the example of FIG. 10, protective layer 24 comprises one flexible region 24B interposed between first and second rigid regions 24A. Flexible region 24B may be a strip that extends across the width of display 14 parallel to and aligned with bend axis 22. Aligning flexible region 24B with bend axis 22 may facilitate bending of display 14 about axis 22. However, if desired, flexible region 24B of protective layer 24 may be offset relative to bend axis 22 and/or may be perpendicular to bend axis 22.

Figure 11:
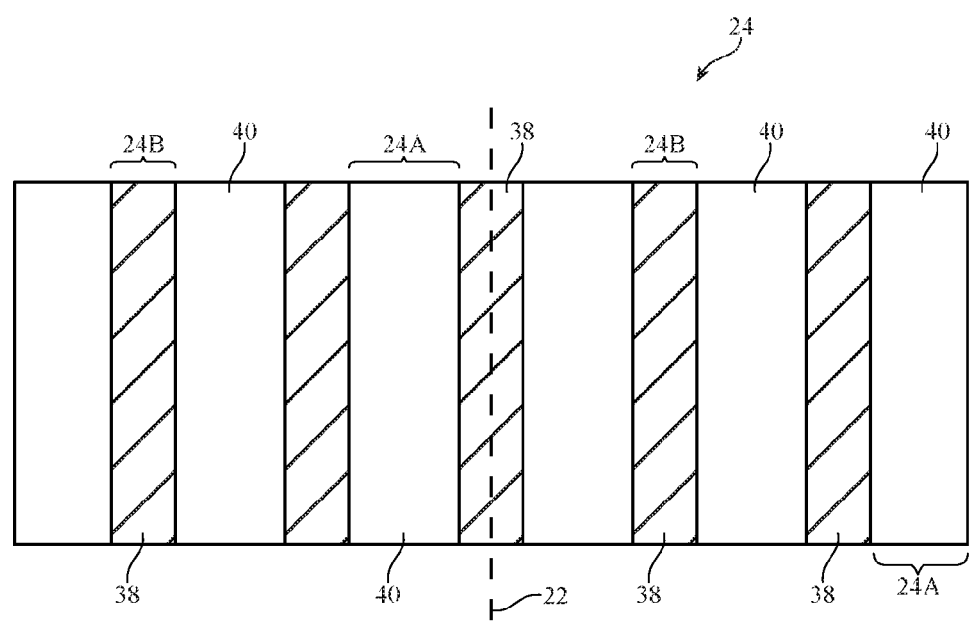

In the example of FIG. 11, protective layer 24 includes multiple flexible regions 24B alternating with multiple rigid regions 24A. Flexible regions 24B and rigid regions 24A are strips that extend across the width of display 14 parallel to bend axis 22. One or more of flexible regions 24B may align with (e.g., overlap) bend axis 22 to facilitate bending of display 14 about axis 22.

Figure 12:
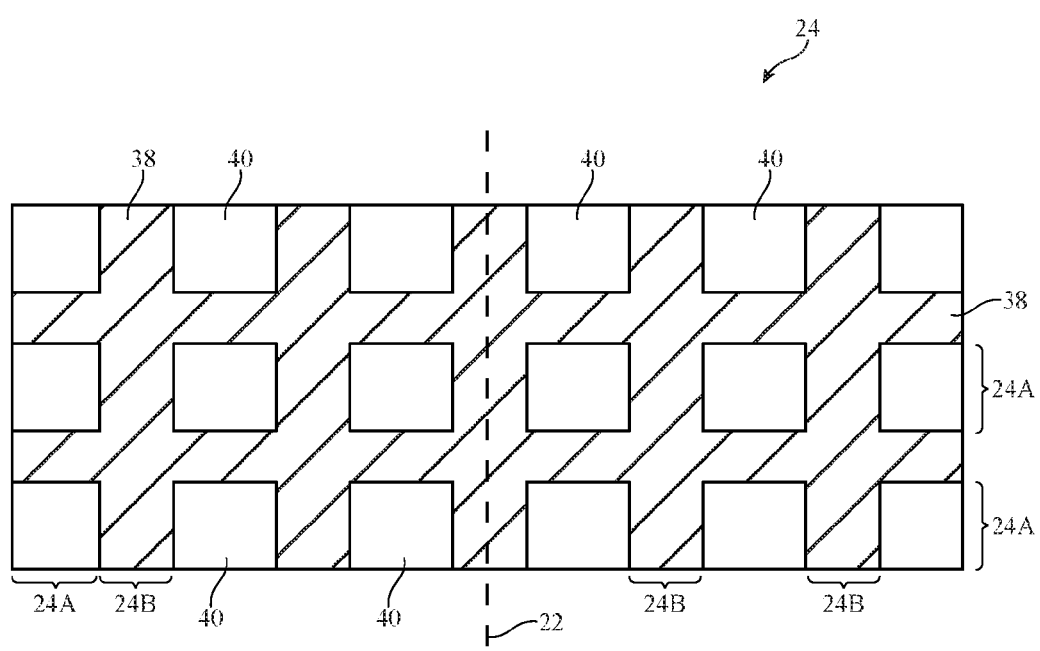
Figure 13:
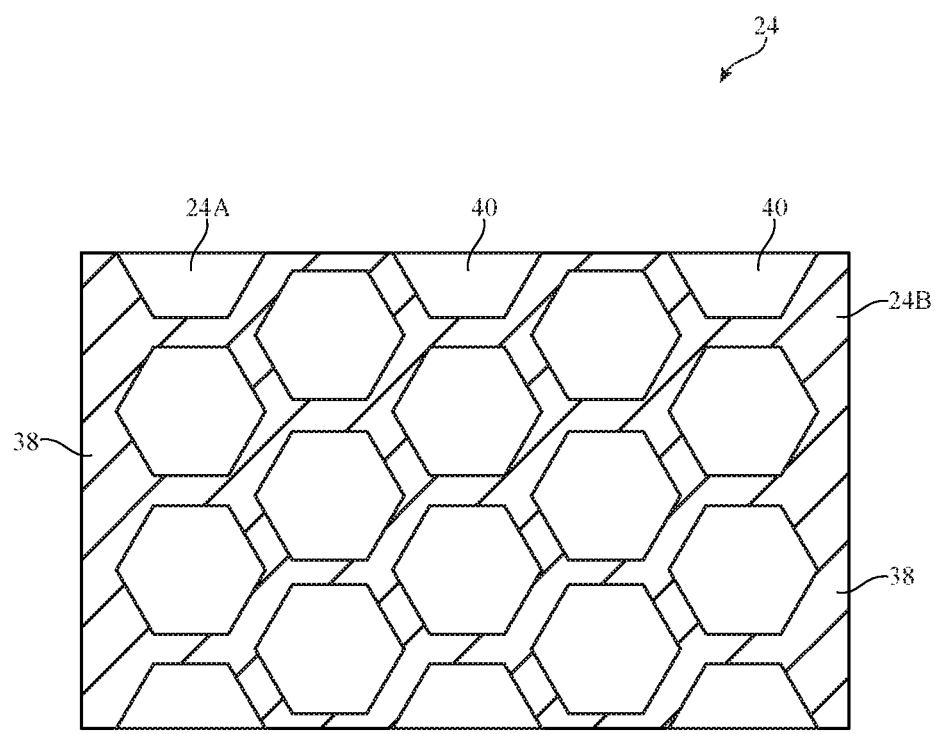

In the example of FIG. 12, protective layer 24 includes flexible regions 24B that extend both across the width of display 14 (e.g., parallel to bend axis 22) and across the length of display 14 (e.g., perpendicular to bend axis 22). This causes some of rigid regions 24A to be completely surrounded by flexible regions 24B. The rectangular shape that the islands of rigid structures 40 have in FIG. 12 is merely illustrative. Rigid structures 40 may have round shapes or other suitable shapes. FIG. 13 shows how flexible regions 24B may be formed in a hexagonal matrix separating hexagonal islands formed by rigid regions 24A.

Figure 14:
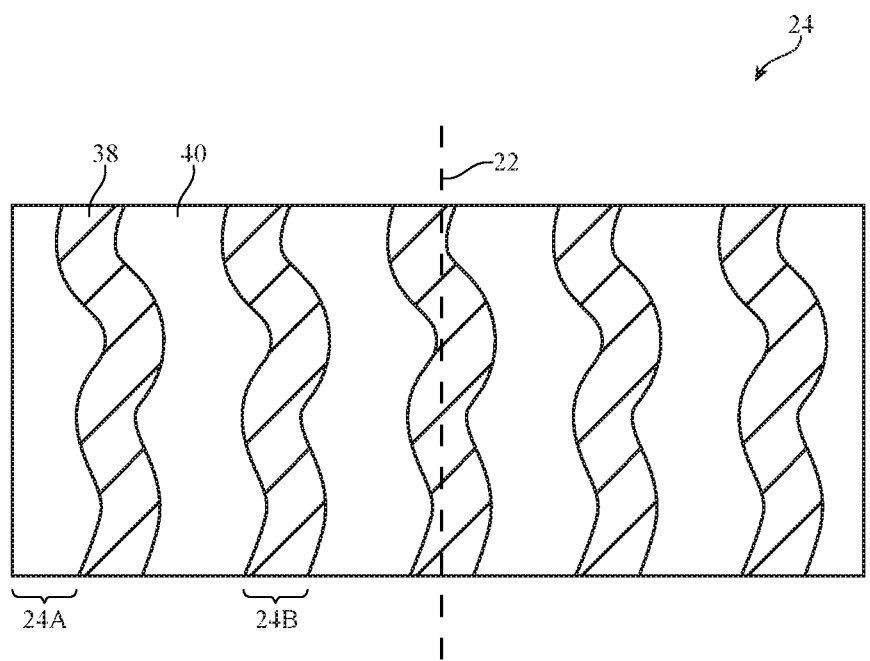
Figure 15:
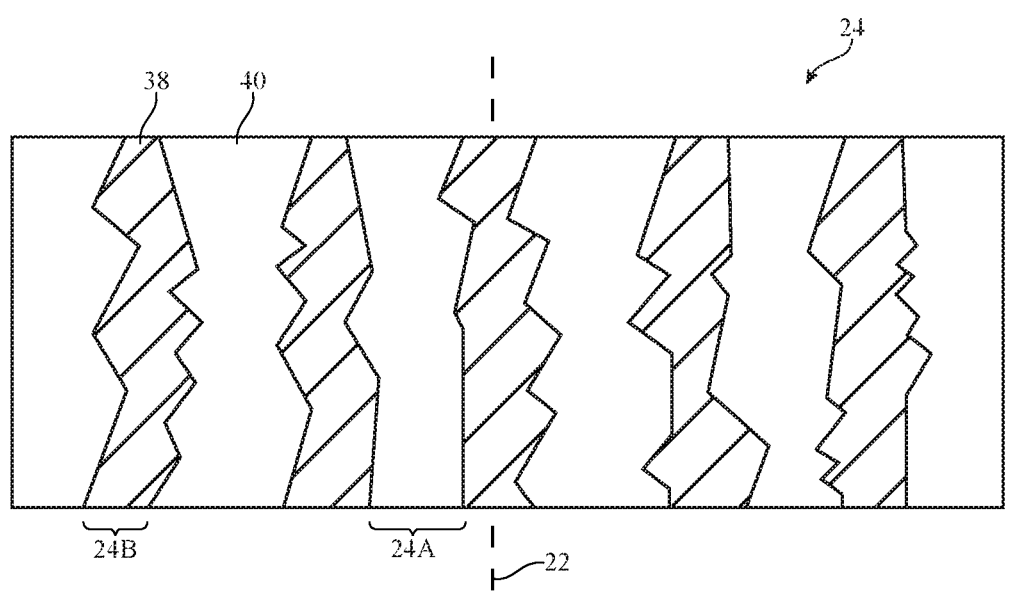
Figure 16:
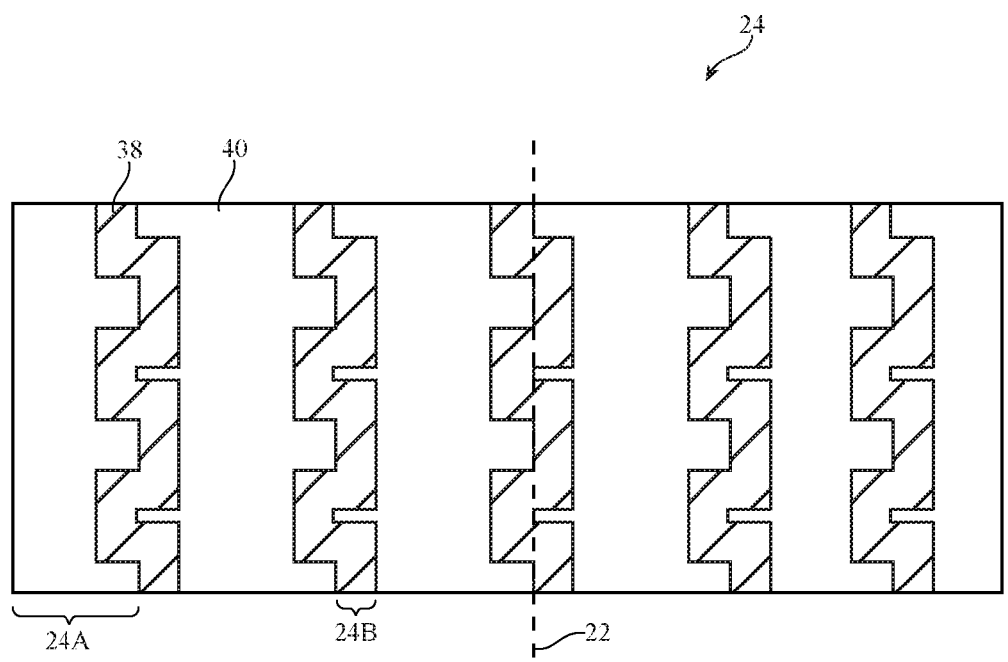

As shown in FIG. 14, flexible regions 24B need not be straight. In the FIG. 14 example, rigid regions 24A and flexible regions 24B each follow a meandering path that extends across the width of display 14. FIG. 15 shows how flexible regions 24B of protective layer 24 may have pseudorandom patterns to help prevent optical interference effects from creating visible artifacts on display 14. In the example of FIG. 16, flexible regions 24B have an elongated shape that extends parallel axis 22 and have interlocking features such as protrusions and recesses that extend perpendicular to axis 22.

Figure 17:
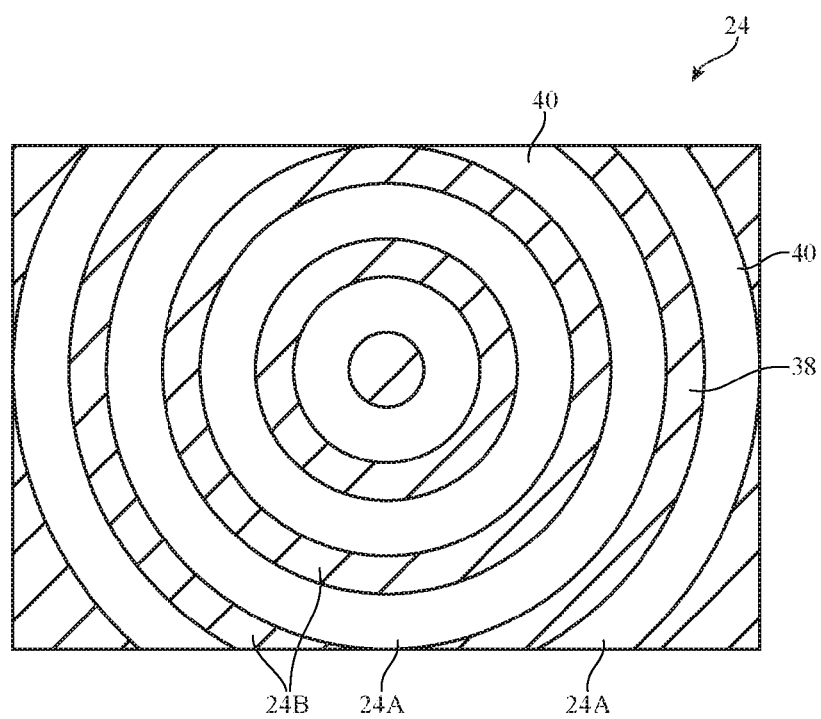

It may be desirable for display 14 to deform along more than one dimension. For example, it may be desirable for display 14 to flex into a shape with compound curves, a dome shape, etc. FIG. 17 is a diagram of protective layer 24 in an illustrative configuration in which flexible regions 24B accommodate deformation along multiple axes. In particular, rigid regions 24A and flexible regions 24B form concentric rings that allow protective layer 24 to deform into the shape of a dome. Other patterns of rigid regions 24A and flexible regions 24B may be provided in display layers such as protective layer 24 or other layers of material in display 14 and/or housing 12 to enhance flexibility about bend axis 22, if desired.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   a housing that bends about a bend axis; and
   a display in the housing that bends about the bend axis, wherein the display comprises a protective layer having a rigid portion formed from a first material and a flexible portion formed from a second material that is different than the first material.

2. The electronic device defined in claim 1 wherein the first material comprises glass.

3. The electronic device defined in claim 1 wherein the second material comprises polymer.

4. The electronic device defined in claim 1 wherein the display comprises an array of pixels that emit light through an upper surface of the display and wherein the protective layer is interposed between the upper surface and the array of pixels.

5. The electronic device defined in claim 1 wherein the display comprises an array of pixels that emit light through an upper surface of the display and wherein the array of pixels is interposed between the upper surface and the protective layer.

6. The electronic device defined in claim 5 further comprising an additional protective layer interposed between the upper surface of the display and the array of pixels, wherein the additional protective layer has a rigid portion and a flexible portion.

7. The electronic device defined in claim 6 wherein the flexible portion of the protective layer and the flexible portion of the additional protective layer are aligned with the bend axis.

8. The electronic device defined in claim 1 wherein the first material comprises glass having a first index of refraction and the second material comprises polymer having a second index of refraction that matches the first index of refraction.

9. The electronic device defined in claim 1 wherein the protective layer comprises an additional rigid portion and wherein the flexible portion is interposed between the rigid portion and the additional rigid portion.

10. The electronic device defined in claim 9 wherein the rigid portion comprises a first glass structure, wherein the additional rigid portion comprises a second glass structure, and wherein the flexible portion comprises a strip of polymer that separates the first glass structure from the second glass structure.

11. The electronic device defined in claim 1 wherein the protective layer comprises a layer of glass and wherein the flexible portion of the protective layer comprises at least one recess in the layer of glass.

12. A flexible display that bends about a bend axis, comprising:
    a touch-sensitive layer;
    an array of pixels formed on a polymer substrate; and
    a support layer comprising a flexible region interposed between first and second rigid regions, wherein the array of pixels is interposed between the touch-sensitive layer and the support layer.

13. The flexible display defined in claim 12 wherein the flexible region comprises polymer.

14. The flexible display defined in claim 13 wherein the first and second rigid regions comprise glass.

15. The flexible display defined in claim 14 wherein the glass has a first index of refraction and the polymer has a second index of refraction that matches the first index of refraction.

16. The flexible display defined in claim 12 wherein the array of pixels overlaps the flexible region of the support layer.

17. A flexible display that bends along a bend axis, comprising:
   a first structural layer having first and second glass sheets joined by a first flexible material;
   a second structural layer having third and fourth glass sheets joined by a second flexible material; and
   an array of pixels interposed between the first and second structural layers.

18. The flexible display defined in claim 17 wherein the first and second flexible materials are aligned with the bend axis.

19. The flexible display defined in claim 17 wherein the first and second glass sheets have a first index of refraction and the first flexible material has a second index of refraction that matches the first index of refraction.

20. The flexible display defined in claim 17 wherein the array of pixels comprises organic light-emitting diode pixels formed on a polymer substrate.

* * * * *